United States Patent
Singh et al.

(10) Patent No.: US 10,790,782 B2
(45) Date of Patent: Sep. 29, 2020

(54) OPTOCOUPLER EMULATING INPUT STAGE FOR DIGITAL ISOLATORS

(71) Applicant: TEXAS INSTRUMENTS INCORPORATED, Dallas, TX (US)

(72) Inventors: Tarunvir Singh, Jalandhar (IN); Kumar Anurag Shrivastava, Bengaluru (IN); Somshubhra Paul, Bengaluru (IN); Sreeram Subramanyam Nasum, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 16/223,545

(22) Filed: Dec. 18, 2018

(65) Prior Publication Data

US 2020/0119689 A1 Apr. 16, 2020

(30) Foreign Application Priority Data

Oct. 12, 2018 (IN) .............................. 201841038738

(51) Int. Cl.
*H03B 5/12* (2006.01)
*H03F 3/45* (2006.01)

(52) U.S. Cl.
CPC ......... *H03B 5/1212* (2013.01); *H03B 5/1228* (2013.01); *H03B 5/1231* (2013.01); *H03F 3/45* (2013.01); *H03F 2200/102* (2013.01)

(58) Field of Classification Search
CPC .. H03B 5/1212; H03B 5/1228; H03B 5/1231; H03F 3/45; H03F 2200/102
See application file for complete search history.

(56) References Cited

U.S. PATENT DOCUMENTS

| | | | | | |
|---|---|---|---|---|---|
| 5,418,497 A | * | 5/1995 | Martin | ................. | H03B 5/1225 331/117 R |
| 6,122,497 A | * | 9/2000 | Gilbert | ................. | H03D 7/1425 455/293 |
| 2016/0080181 A1 | * | 3/2016 | Yun | ......................... | H04L 27/04 375/312 |
| 2016/0269075 A1 | * | 9/2016 | Masson | ................ | H04B 1/7174 |

* cited by examiner

*Primary Examiner* — Jeffrey M Shin
(74) *Attorney, Agent, or Firm* — John R. Pessetto; Charles A. Brill; Frank D. Cimino

(57) ABSTRACT

A digital isolator comprising a set of bipolar transistors and an inductor capacitor (LC) oscillator coupled to the set of bipolar transistors in series, wherein the LC oscillator is configured to be turned on and off based on the current applied to the set of bipolar transistors or the LC oscillator and generate a set of differential signals based on the current flowing through the set of bipolar transistors and mimicking the operational characteristics of an optocoupler.

13 Claims, 11 Drawing Sheets

OPTOCOUPLER EMULATING INPUT STAGE FOR DIGITAL ISOLATORS

RELATED APPLICATIONS

This application claims priority to Indian Provisional Application No. 201841038738, filed Oct. 12, 2018, which is hereby incorporated by reference.

BACKGROUND

An optocoupler transmits signals between isolated circuits. A transmitting end of an exemplary optocoupler emits light based on a signal to be transmitted. A receiving end of the exemplary optocoupler comprises a switch responsive to the light. The switch of the receiving end is activated to generate a signal based on the light. The generated signal reflects the signal activating a LED of the transmitting end emitting the light.

Utilizing the LED, the exemplary optocoupler transmits a signal while preventing voltage or current of the transmitting end from affecting the receiving end. The LED employed by the exemplary optocoupler has a current-voltage (IV) characteristic of a diode. Optocoupler emulators, designed to replace an optocoupler, generally fails to completely mimic the operational characteristics of an optocoupler employing a LED with a diode IV characteristic.

SUMMARY

An aspect of the present invention provides a diode emulating oscillator comprising a set of bipolar junction transistors coupled in series, an inductor capacitor (LC) oscillator coupled to the set of bipolar junction transistors, and a current mirror transistor coupled to the set of bipolar junction transistors and the LC oscillator, wherein the LC oscillator is configured to generate a modulated signal based on a current flowing through the current mirror transistor when a current flows through the set of bipolar junction transistors.

An aspect of the present invention also provides a digital isolator comprising a diode emulating oscillator configured to generate a modulated signal, an isolation barrier configured to transmit the modulated signal, and a receiver configured to receive and demodulate the modulated signal, wherein the diode emulating oscillator comprises a set of bipolar junction transistors and an inductor capacitor (LC) oscillator coupled to the set of bipolar junction transistors in parallel, and wherein the LC oscillator is configured to generate the modulated signal when a current flows through the set of bipolar junction transistors.

An aspect of the present invention further provides a digital isolator comprising a diode emulating oscillator configured to generate a spread spectrum modulated signal, an isolation barrier configured to transmit the spread spectrum modulated signal, and a receiver configured to receive and demodulate the spread spectrum modulated signal, wherein the diode emulating oscillator comprises a set of bipolar junction transistors, an inductor capacitor (LC) oscillator coupled to the set of bipolar junction transistors in parallel, and a spread spectrum module coupled to the LC oscillator, and wherein the LC oscillator is configured to generate a modulated signal when a current flows through the set of bipolar junction transistors and the spread spectrum module is configured to adjust a frequency of the modulated signal to generate the spread spectrum modulated signal.

An aspect of the present invention further provides a digital isolator comprising a diode emulating oscillator configured to generate a modulated signal, an isolation barrier configured to transmit the modulated signal via a channel, and a receiver configured to receive and demodulate the modulated signal, wherein the diode emulating oscillator comprises an inductor capacitor (LC) oscillator circuit configured to generate an on-off key based modulated signal after an application of current or voltage input above a threshold of the LC oscillator circuit, wherein the on-off key based modulated signal reflects the application of current or voltage input above the threshold and an amplitude of the input.

BRIEF DESCRIPTION OF THE DRAWINGS

For a detailed description of various examples, reference will now be made to the accompanying drawings in which.

DETAILED DESCRIPTION

In the following detailed description, reference is made to certain examples of the present invention. These examples are described with sufficient detail to enable those skilled in the art to practice them. It is to be understood that other examples may be employed and that various structural, logical, and electrical changes may be made. Moreover, while specific examples are described in connection with a digital isolator, it should be understood that features described herein are generally applicable to other types of electronic parts or circuits.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Figure 1:
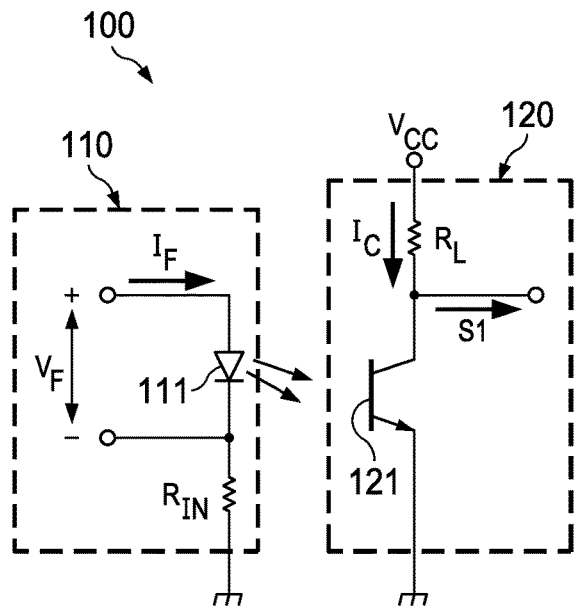
FIG. 1 illustrates an exemplary digital isolator transmitting a signal with a LED.

FIG. 1 illustrates an exemplary optocoupler 100 transmitting a signal with a LED 111. When voltage $V_F$ is applied to the transmitting end 110, current $I_F$ flows through LED 111 and LED 111 emits a light. The light activates a bipolar junction transistor 121 of the receiving end 120 of the optocoupler 100. When the bipolar junction transistor 121 is activated, current $I_C$ flows through the bipolar junction transistor 121 and the receiving end 120 generates a signal S1 reflective of the LED light.

When voltage $V_F$ or current $I_F$ represents data (e.g., when $V_F$ or $I_F$ is applied to the transmitting end 111 when a data to be transmitted is "1"), the LED 111 emits light that reflects the data (e.g., the LED 111 emits light when a data to be transmitted is "1"). Signal S1 generated from the receiving end 120, in turn, reflects the data (e.g., S1 is output when a data transmitted by the transmitting end 110 is "1"). Accordingly, data has been transmitted from the transmitting end 110 to the receiving end 120 while the transmitting end 110 and the receiving 120 are electrically isolated.

Systems requiring power or noise isolation between two domains use an optocoupler, an example of which is illustrated in FIG. 1, to transmit data between the two domains. Such systems may include a sensor node and a motor interfaced by a mobile control unit, wherein the motor side of the domain uses a high voltage that needs to be isolated from the sensor node. Such system may also be a system that has very large voltage transients between two or more grounds.

Figure 2:
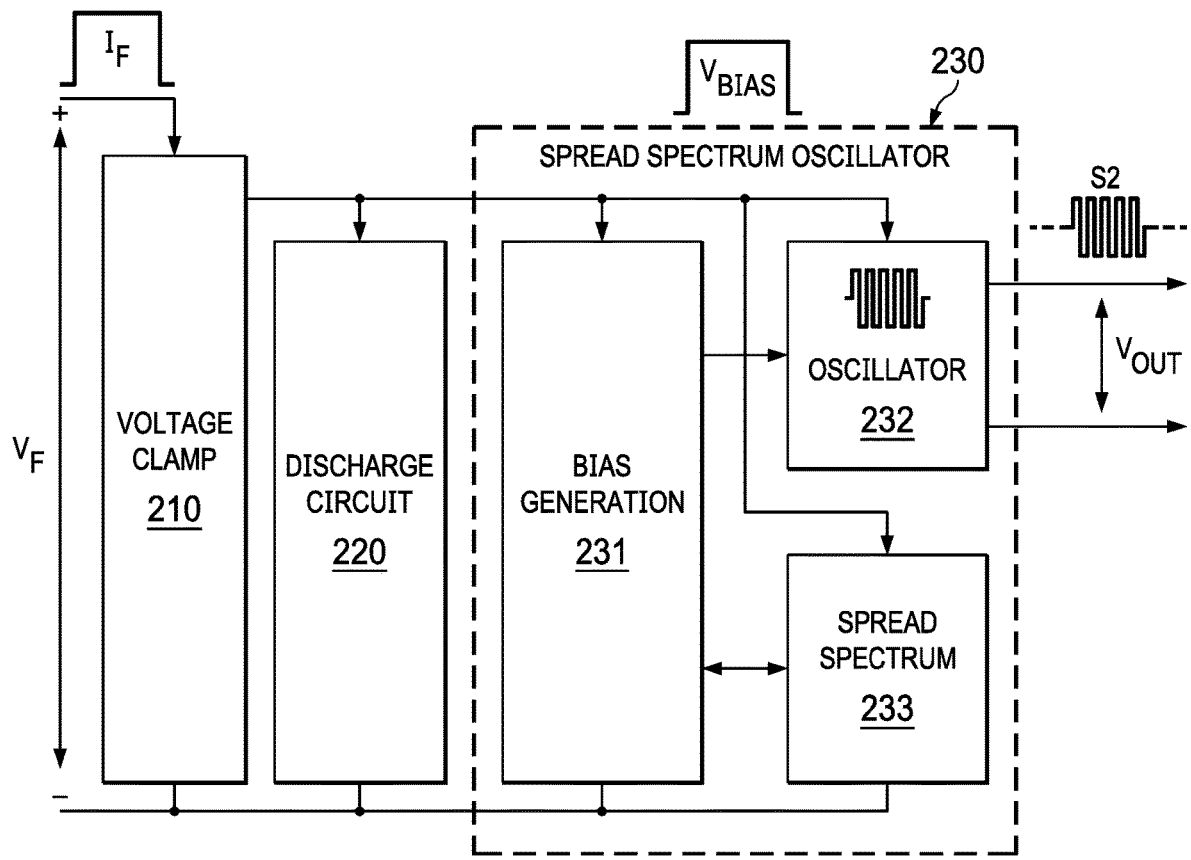
FIG. 2 illustrates a digital isolator with an optocoupler emulated input according to a prior art.

FIG. 2 illustrates a digital isolator with an optocoupler emulated input according to a prior art. The digital isolator 200 according to a prior art comprises a voltage clamp 210, to which voltage $V_F$ or current $I_F$ is applied based on a preferred configuration, a discharge circuit 220 to discharge excess voltage or current, and a spread spectrum oscillator 230 generating a spread spectrum modulated signal based on voltage $V_F$ or current $I_F$.

The spread spectrum oscillator 230 comprises a bias generation module 231, an oscillator 232, and a spread spectrum module 233. The bias generation module 231 applies $V_{Bias}$ to oscillator 232 after voltage $V_F$ or current $I_F$ over a predetermined threshold is applied to the digital isolator 200. When $V_{Bias}$ is applied, the oscillator 232 generates a modulated signal. Spread spectrum module 233 adjusts the frequency of the modulated signal of the oscillator 232 so that the frequency of the modulated signal is spread across spectrum and prevents high electromagnetic radiation. The spread spectrum modulated signal S2 is output via $V_{Out}$ of the spread spectrum oscillator 230.

A goal of digital isolator 200 is to mimic the operational characteristics of a digital isolator with a LED with an IV characteristic of a diode. Another goal of digital isolator 200 is to be compatible with the systems and parts of an optocoupler.

The prior art digital isolator of FIG. 2, however, is constructed without diodes and fails to completely mimic the operational characteristics of an optocoupler or a digital isolator with a LED. Also, a digital isolator constructed using CMOS transistors, such as the prior art digital isolator of FIG. 2, is much more expensive than an optocoupler, making it less competitive.

Figure 3:
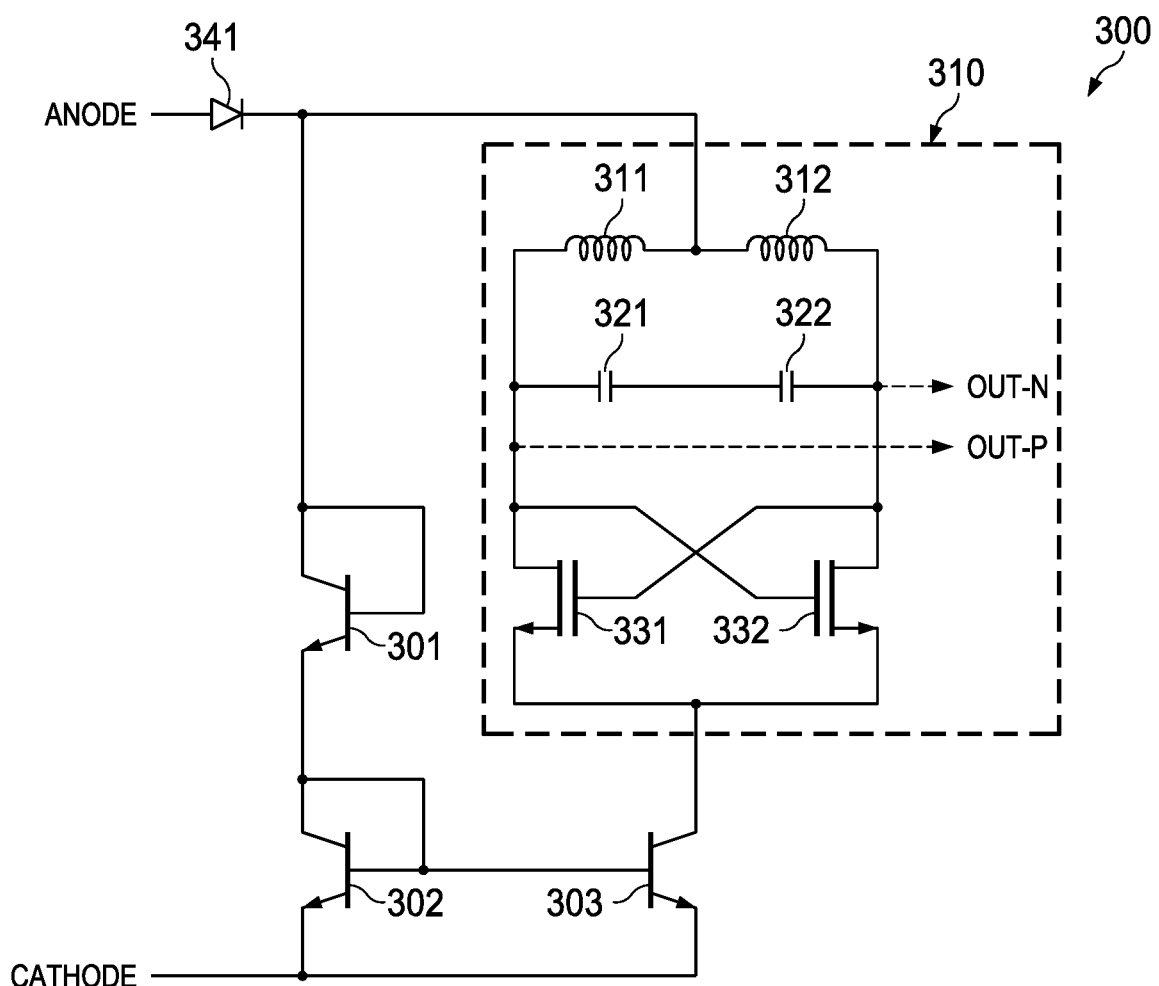
FIG. 3 illustrates an exemplary circuit of a diode emulating isolator according to an aspect of the present invention.

FIG. 3 illustrates an exemplary circuit of a diode emulating isolator according to an aspect of the present invention. The diode emulating isolator 300 of FIG. 3 comprises a set of bipolar junction transistors 301, 302 coupled in series, an inductor capacitor (LC) oscillator 310 coupled to the set of bipolar junction transistors 301, 302 in parallel, and a current mirror transistor 303 coupled to the set of bipolar junction transistors 301, 302 and the LC oscillator 310. The diode emulating isolator 300 of FIG. 3 may further comprise a diode 341 to prevent a reverse current flow when current is applied to the diode emulating oscillator 300.

According to an aspect of the present invention, diode 341 may be replaced with CMOS or any other reverse current flow preventing circuitry.

When a current or voltage above a current or voltage threshold of bipolar junction transistors 301, 302 is applied to diode emulating isolator 300, bipolar junction transistors 301, 302 are turned on. A base of current mirror transistor 303 is coupled to a base of one transistor 302 of the set of bipolar junction transistors 301, 302. When current flows through the one transistor 302 of the set of bipolar junction transistors 301, 302, current mirror transistor 303 is turned on.

The collector of the current mirror transistor 303 is coupled to LC oscillator 310. When current flows through the set of bipolar junction transistors 301, 302, and current mirror transistor 303, LC oscillator 310 is excited to generate a high frequency modulated signal. In the example of FIG. 3, the LC oscillator 310 generates a set of differential signals that is output via port OUT-N and port OUT-P.

LC oscillator 310 comprises a set of inductors 311, 312, which are coupled in series, and a set of capacitors 321, 322, which are coupled in series. The set of capacitors 321, 322 is coupled to the set of inductors 311, 312 in parallel. The LC oscillator 310 further comprises a CMOS transistor 331, 332 amplifying the signals of LC oscillator when the LC oscillator 310 is excited upon a current application to the diode emulating oscillator 300, wherein the current applied is above the current threshold of the bipolar junction transistors 301, 302. According to an aspect of the present invention, LC oscillator 310 may comprise an oscillator of a different architecture, and is not limited to the exemplary circuitry illustrated in FIG. 3.

When LC oscillator 310 is excited by the above threshold current or voltage application to the diode emulating oscillator 300, a set of high frequency differential signals is generated and output across the set of capacitors 321, 322. As noted below regarding FIG. 4, the set of differential signals is transmitted across the isolator barrier to communicate to the receiver of a digital isolator presence of data.

When a current applied to the diode emulating oscillator 300 is below a current threshold of LC oscillator 310, an output of a set of differential signals via port OUT-N and port OUT-P is not guaranteed because LC oscillator 310 requires a minimum current to start oscillating. This is similar to the operational characteristics of an optocoupler where a LED may or may not be fully lit where a current below a diode current threshold is applied to the optocoupler.

When no current is applied to the diode emulating oscillator 300, LC oscillator 310 is off and communication channels across port OUT-N and port OUT-P are silent.

Figure 4:
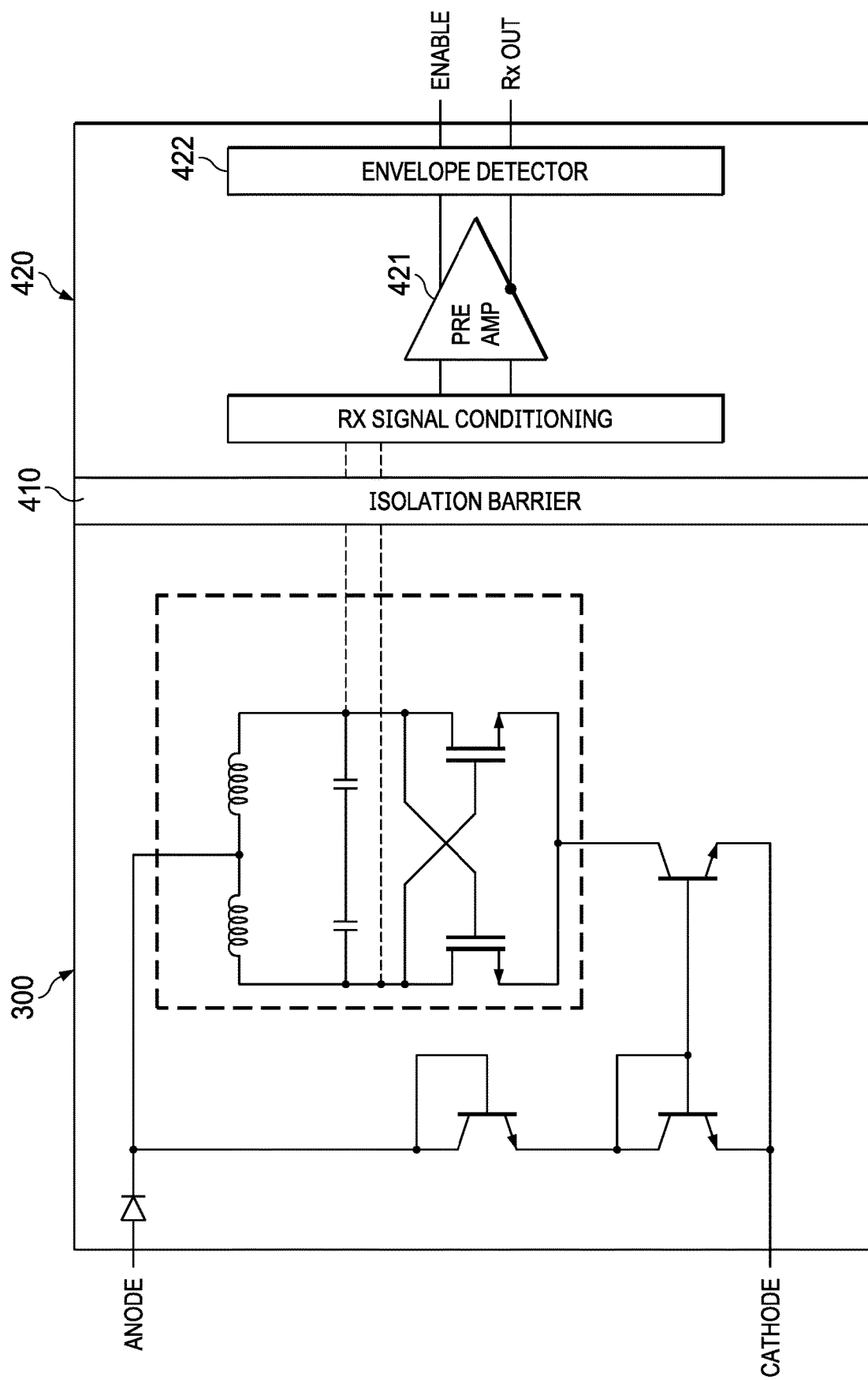
FIG. 4 illustrates a digital isolator according to an aspect of the present invention.

FIG. 4 illustrates a digital isolator according to an aspect of the present invention. The digital isolator of FIG. 4 comprises a diode emulating oscillator 300, an isolator barrier 410, and a receiver 420. The isolator barrier 410 comprises capacitors to transmit the set of differential signals output from port OUT-N and port OUT-P of diode emulating oscillator 300 to receiver 420. According to an aspect of the present invention, isolation barrier 410 may also comprise inductors or other forms of capacitive or inductive circuitry to transmit the signal output.

Receiver 420 comprises a pre-amplifying module 421 amplifying the set of differential signals generated and transmitted from diode emulating oscillator 300. Receiver 420 further comprises an envelop detector 422 to detect the modulated signal transmitted by the diode emulating oscillator 300 after the modulated signal is amplified by the pre-amplifying module 421.

The examples illustrated in FIG. 3 and FIG. 4 provide a new, simple architecture for emulating an optocoupler. The diode emulating oscillator 300 of FIGS. 3 and 4 modulates signals based on on-off keying. LC oscillator 310 is turned on when a data to be transmitted is present and an input current or voltage higher than the threshold value of the bipolar junction transistors 301, 302 is applied to the diode emulating oscillator 300. This in turn excites the LC oscillator 310 to generate a set of differential signals output via port OUT-N and port OUT-P. There is no need for a separate power on circuit to turn on LC oscillator 310. Conversely, when data to be transmitted is "0," no current is applied to the bipolar junction transistors 301, 302. LC oscillator 310 is turned off, and no signals are output via port OUT-N and port OUT-P.

Furthermore, a voltage of two diode drops is maintained across the set of bipolar junction transistors 301, 302. As such, unlike the prior art of FIG. 2, the examples of FIG. 3 and FIG. 4 do not require an active internal voltage, current regulation.

In addition, differential signal drivers are not necessary for the diode emulating oscillator 300 to drive the capacitors of the isolation barrier 410 because the LC oscillator 310 inherently drives the capacitors of the isolator barrier 410 differentially. Low cost version of a digital isolator can be also realized because the CMOS transistors 331, 332 of LC oscillator 310 may be replaced with bipolar junction transistors. The architecture of FIG. 3 and FIG. 4 further minimizes the number of base masks and isolation of voltage or noise can be realized by having the isolator barrier (410), e.g., capacitors, implemented only on the receiver 420. This further reduces the cost of the diode emulating oscillator 310 die.

According to an example of the present invention, the current gain value of current mirror transistor 303 in relation to the current gain value of transistor 302 can be adjusted. For instance, when the current gain value of current mirror transistor 303 is ten (10) times the current gain value of transistor 302, a current applied to LC oscillator 310 is ten times the current applied to the set of bipolar junction transistors 301, 302. By adjusting the current gain value of current mirror transistor 303 in relation to the current gain value of transistor 302, diode emulating oscillator 300 can adjust the amount of current channeled to LC oscillator 310 to generate a modulated signal to be transmitted.

In the examples of FIGS. 3 and 4, the amplitude of the modulated signal output from the LC oscillator 310 is dependent on the value of input to the diode emulating oscillator 300. According to an aspect of the present invention, the change in the amplitude of the modulated signal output from the LC oscillator 310 is detectable from the receiver 420. For instance, the envelop detector 422 may detect the change in the amplitude of the modulated signal transmitted across the isolation barrier 410, which reflects the change in the size of current or voltage applied to the diode emulating oscillator 300. Accordingly, analog signal can be transmitted more effectively while maintaining analog signal isolation.

Figure 5:
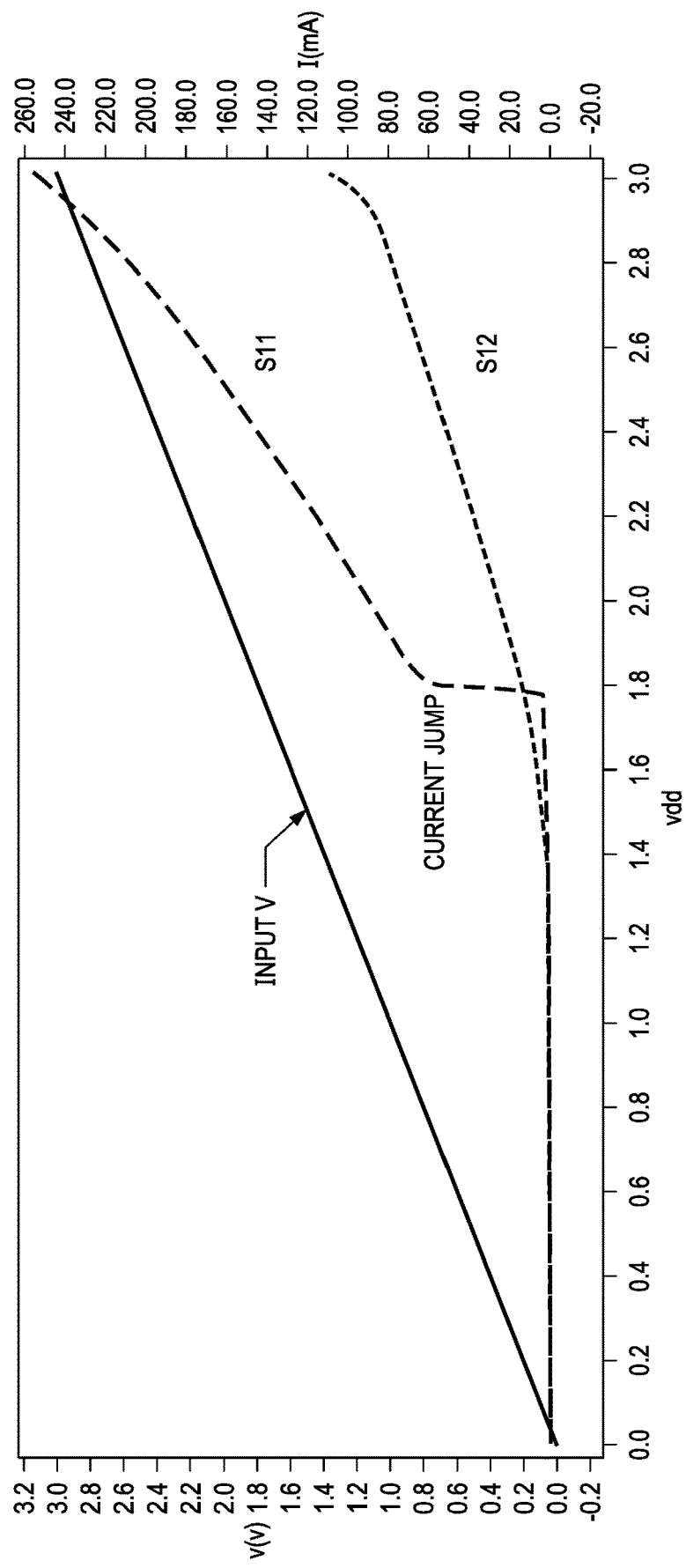
FIG. 5 illustrates the IV sweep of the diode emulating oscillator according to an aspect of the present invention.

FIG. 5 illustrates the IV sweep of the diode emulating oscillator 300 according to an aspect of the present invention. The input V indicates the voltage applied to the anode and cathode of the diode emulating oscillator 300. The current line of the prior art of FIG. 2, S11, illustrates a current jump around input V of 1.6-1.8V. The current line of the diode emulating oscillator 300, S12, illustrates no current jump around input V of 1.6-1.8V, more accurately mimicking the IV characteristics of a diode.

Figure 6:
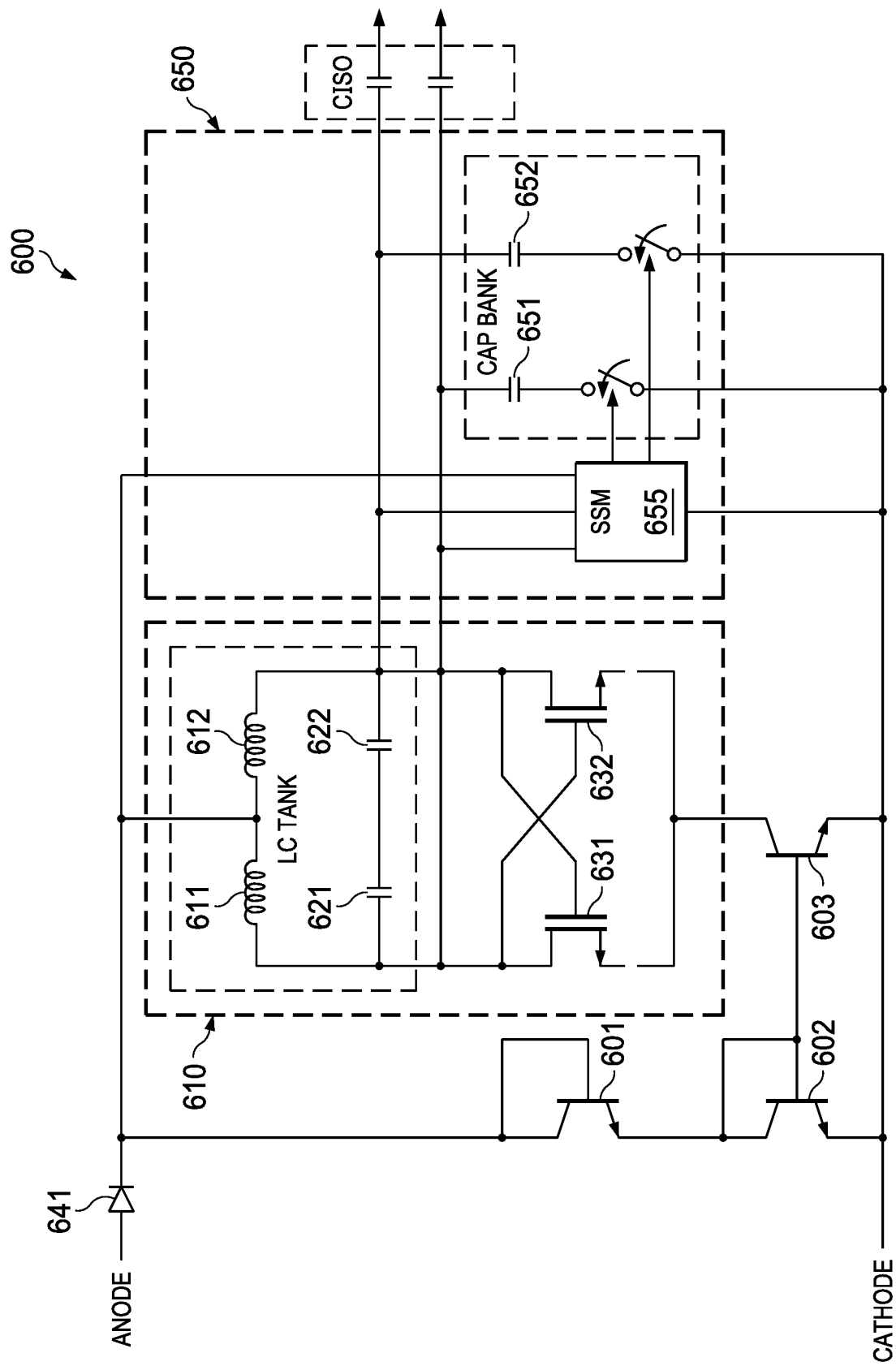
FIG. 6 illustrates an architecture of a diode emulating oscillator according to another aspect of the present invention.

FIG. 6 illustrates an architecture of a diode emulating oscillator according to another aspect of the present invention. Diode emulating oscillator 600 of FIG. 6 comprises a set of bipolar junction transistors 601, 602, a current mirror transistor 603, a LC oscillator 610, and a diode 641. The operations and functions of bipolar junction transistors 601, 602, current mirror transistor 603, LC oscillator 610, and diode 641 is comparable to the operations and functions of bipolar junction transistors 301, 302, current mirror transistor 303, LC oscillator 310, and diode 341 of FIG. 3. According to an aspect of the present invention, LC oscillator 610 may comprise an oscillator of a different architecture, and is not limited to the exemplary circuitry illustrated in FIG. 6.

Diode emulating oscillator 600 of FIG. 6 example further comprises a spread spectrum module 650. Spread spectrum module 650 comprises a set of switchable capacitors 651, 652, and a spread spectrum module controlling unit 655 configured to turn on or turn off the set of switchable capacitors 651, 652. Although FIG. 6 illustrates two switchable capacitors 651, 652, more or less capacitors may be employed depending on a need to adjust the modulating frequency.

The set of switchable capacitors 651, 652 is coupled to the set of capacitors 621, 622 of LC oscillator 610. By turning on and off the set of switchable capacitors 651, 652, spread spectrum module 650 adjusts the frequency of the modulated signal generated by LC oscillator 610. The frequency of the modulated signal output of LC oscillator 610 is based on the resonating frequency of the inductors and capacitors of a LC oscillator. By turning on and off the switchable capacitors 651, 652, the effective capacitance in the LC tank changes, hence changing the resonating frequency of the LC oscillator. The modulated signal frequency of the LC oscillator 610 is hence spread across a wider spectrum.

In FIG. 6, a voltage over the set of bipolar junction transistors 601, 602 operates as a power source to spread spectrum module 650. No separate power source is required to turn on or off spread spectrum module 650. In addition, the voltage over the set of bipolar junction transistors 601, 602 is maintained to two diode voltage drops. Accordingly, no current or voltage regulation is required.

Figure 7:
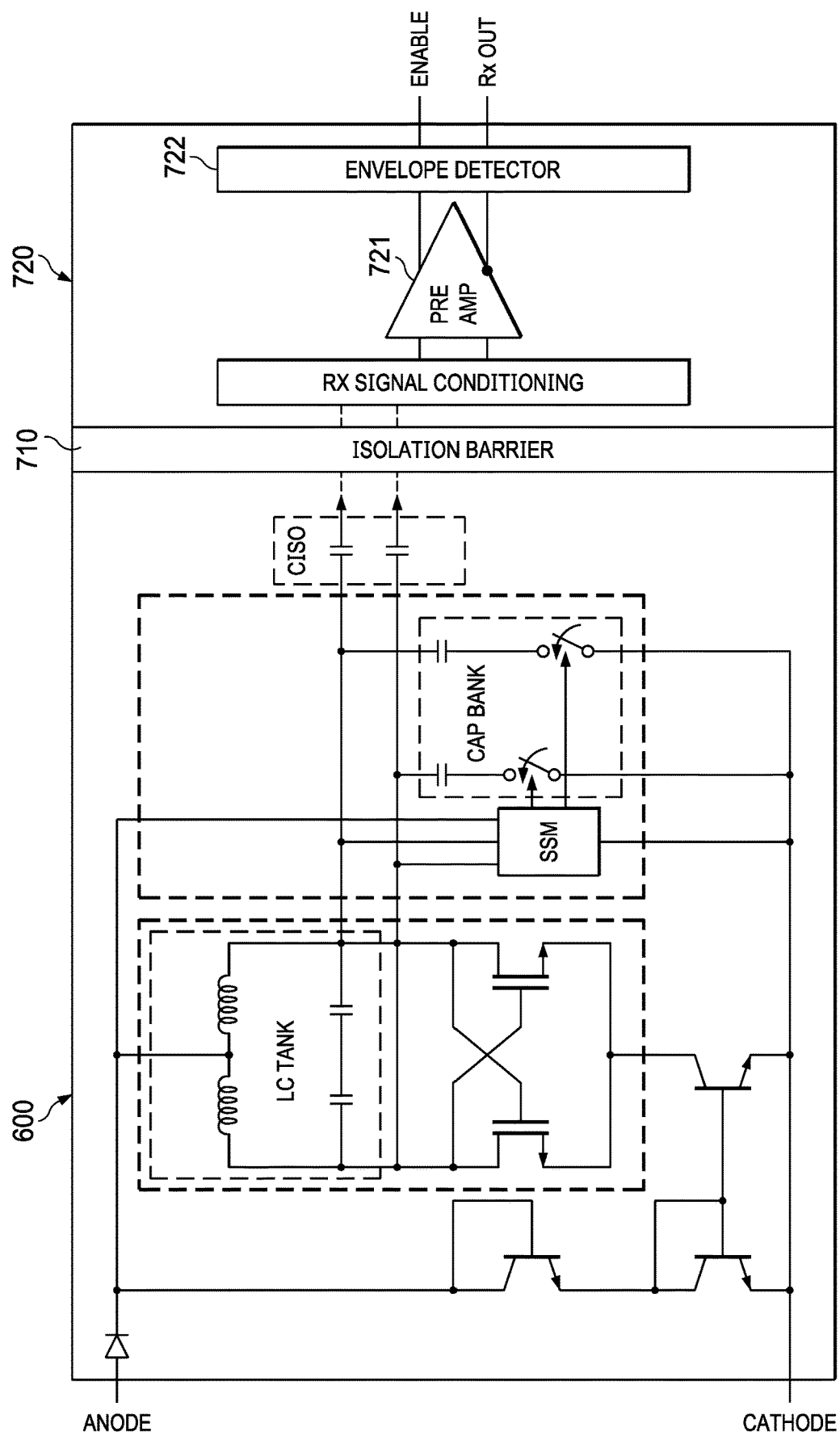
FIG. 7 illustrates a digital isolator according to an aspect of the present invention.

FIG. 7 illustrates a digital isolator according to an aspect of the present invention. The digital isolator of FIG. 7 comprises the diode emulating oscillator 600 of FIG. 6, an isolator barrier 710, and a receiver 720. The operations and functions of isolation barrier 710 and receiver 720 are comparable to the operations and functions of isolation barrier 410 and receiver 420 of FIG. 4.

The spread spectrum modulated signal output from diode emulating oscillator 600 is output via port OUT-N and port OUT-P and transmitted to receiver 720 via channel formed across the capacitors of isolation barrier 710. The capacitors of isolation barrier 710 transmits the spread spectrum modulated signal to the receiver 720 while preventing voltage and noise from being transmitted. According to an example of the present invention, isolation barrier 710 may comprise an inductor, or any other types of capacitive or inductive circuitry.

Figure 8:
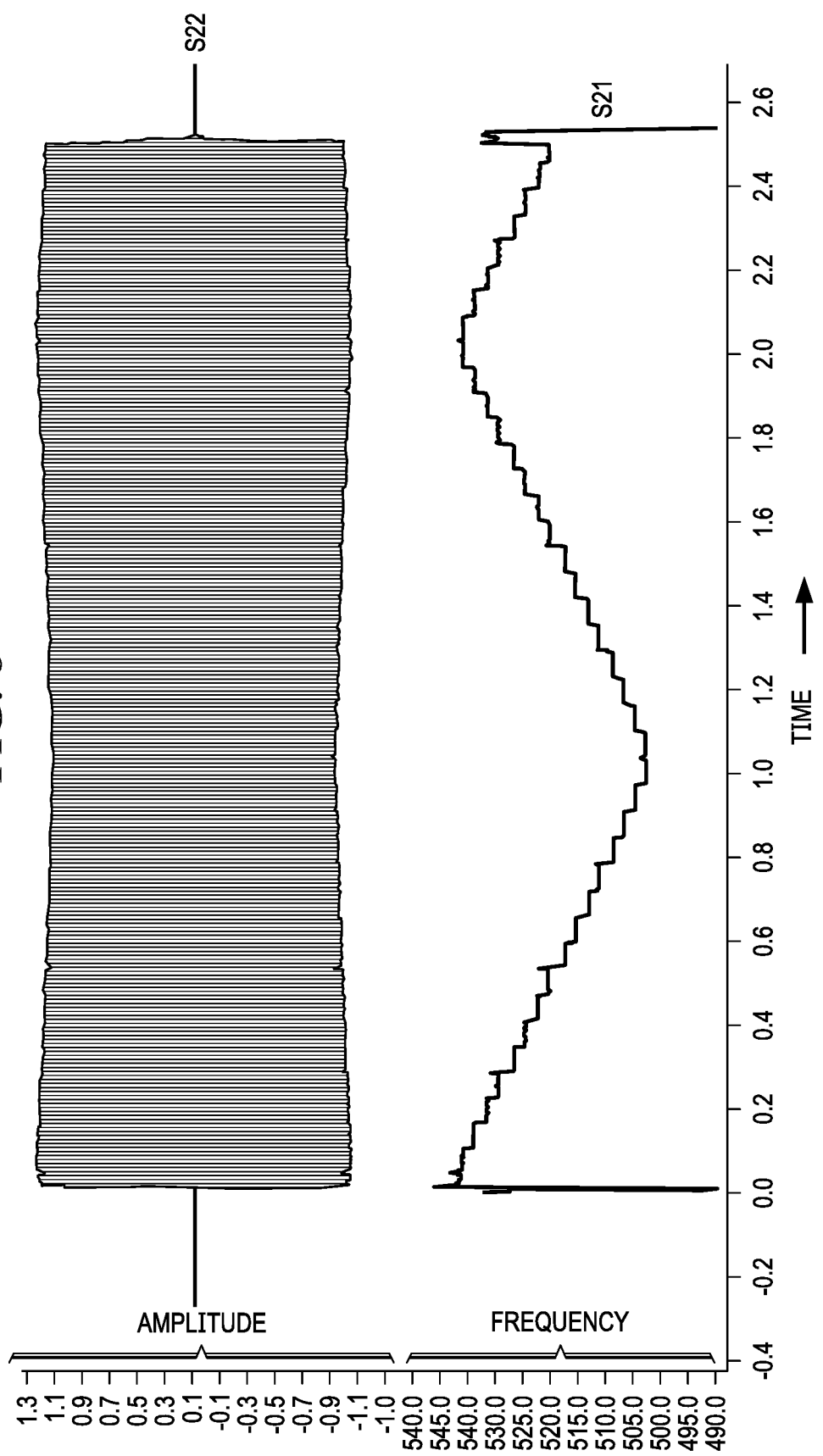
FIG. 8 illustrates the change of frequency of the spread spectrum modulated signal transmitted from diode emulating isolator to receiver over time, and the corresponding amplitude of the spread spectrum modulated signal also over time.

FIG. 8 illustrates the change of frequency (S21) of the spread spectrum modulated signal transmitted from diode emulating isolator 600 to receiver 720 over time, and the corresponding amplitude of the spread spectrum modulated signal (S22) also over time. By adjusting the frequency of the modulated signal and spreading the frequency across spectrum, electromagnetic emissions may be controlled.

Figure 9:
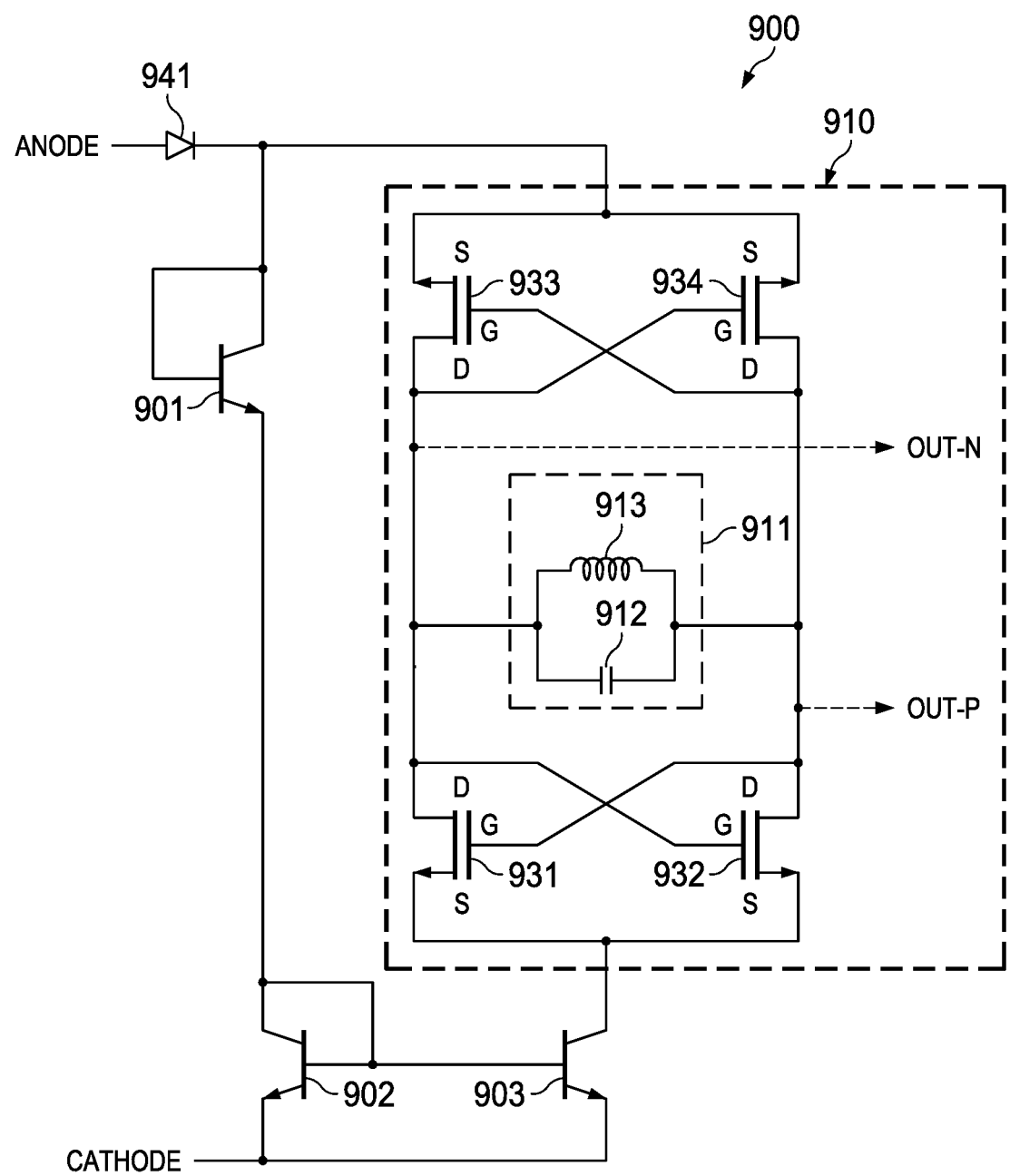
FIGS. 9-13 illustrates exemplary circuits of diode emulating isolator according to various aspects of the present invention.

FIG. 9 illustrates an exemplary circuit of diode emulating isolator according to an aspect of the present invention. In particular, the example of FIG. 9 comprises a set of bipolar junction transistors (BJTs) 901, 902 coupled in series, LC oscillator 910 coupled to the set of BJTs 901, 902 in parallel, a current mirror transistor 903 coupled to the set of BJTs 901, 902 and LC oscillator 910. The diode emulating isolator 900 of FIG. 9 may also comprise a diode 941 to prevent reverse current flow when current is applied to the diode emulating oscillator. According to an aspect of the present invention, diode 941 may be replaced with CMOS transistor or any other reverse current flow preventing circuity. The set of BJTs 901, 902, current mirror transistor 903, and diode 941 of FIG. 9 are comparable and operate similarly to the set of BJTs 301, 302, current mirror transistor 393, and diode 341 of FIG. 3, respectively.

After an input of current or voltage over a threshold of the set of BJTs 901, 902 and a threshold of LC oscillator 910 is applied to diode emulating isolator 900, LC oscillator 910 is excited to output a pair of differential signals reflecting the current or voltage input via ports OUT-N and OUT-P. The pair of differential signals is on-off key based modulated signals and the amplitude of the modulated signals is positively correlated with the amplitude of the current or voltage input. For instance, when a higher voltage or current is applied to the diode emulating isolator 900, the pair of differential signals output has a bigger amplitude. The amplitude of the differential signals may be detected by an envelope detector of a receiver (e.g., 422, 722).

LC oscillator 910 of FIG. 9 example comprises an inductor capacitor (LC) tank circuit 911, and a set of transistors 931, 932, 933, 934 coupled to LC tank circuit 911. In particular, LC tank circuit 911 comprises inductor 913, and capacitor 912 coupled to inductor 913 in parallel. The set of transistors 931, 932, 933, 934 comprises a first pair of cross coupled NMOS transistors 931, 932 and a second pair of cross coupled PMOS transistors 933, 934.

A drain of first transistor 931 of first pair of NMOS transistors 931, 932 is coupled to a first end of LC tank circuit 911, and a drain of a second transistor 932 of first pair of NMOS transistors 931, 932 is coupled to a second end LC tank circuit 911. Further, sources of first and second transistors 931, 932 of the first pair of NMOS transistors 931, 932 are coupled to a collector of current mirror transistor 903

A drain of first transistor 933 of second pair of PMOS transistors 933, 934 is coupled to the first end of LC tank circuit 911 and a drain of second transistor 934 of second pair of PMOS transistors 933, 934 is coupled to the second end of LC tank circuit 911. Further, sources of first and second transistors 933, 934 of second pair of PMOS transistors 933, 934 are coupled to an end of the set of BJTs 901, 902 configured to receive input current or voltage.

The current or voltage input to diode emulating oscillator 900 is applied to the center tap of LC oscillator 910 coupled to the sources of transistors 933, 934 of second pair of PMOS transistors 933, 934.

FIGS. 10-13 illustrate additional exemplary circuits of diode emulating isolator according to various aspects of the present invention. In particular, the examples of FIGS. 10-13 illustrate diode emulating oscillator 1000 including various LC oscillator circuit according to an example of the present invention. A LC oscillator circuit of diode emulating oscillator 1000 is excited upon an application of current or voltage input above a threshold of the LC oscillator circuit.

When the LC oscillator circuit of diode emulating oscillator 1000 operates, it generates a pair of differential signals output from port OUT-N and port OUT-P. The pair of differential signals comprises an on-off key based modulated signal and the amplitude of the pair of differential signals reflect the amplitude of the input current or voltage. An envelope detector of a receiver of the on-off key based modulated signal may detect the amplitude of the pair of differential signals, in addition to the presence of above threshold input or current input to diode emulating isolator 1000.

An IV sweep result of diode emulating oscillator 1000 of FIGS. 10-13 is analogous to the IV sweep line S12 of FIG. 5 and closely tracks the IV operational characteristics of a diode.

Figure 10B:
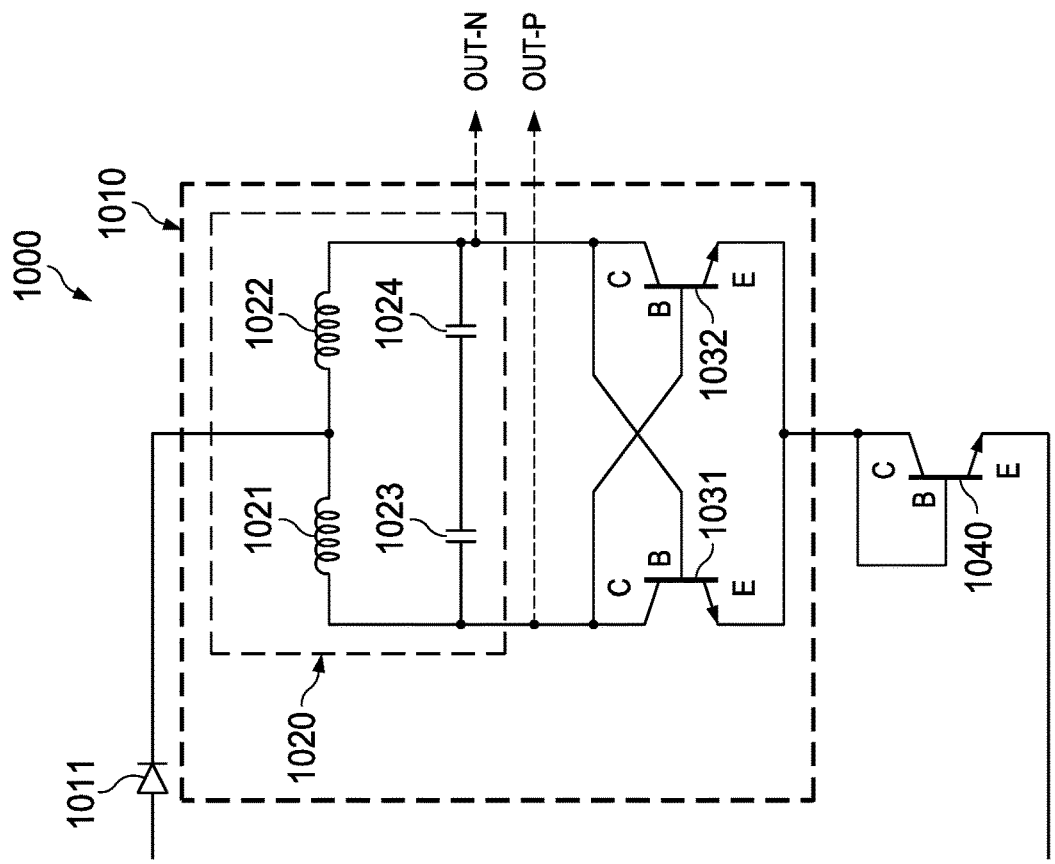
Figure 10A:
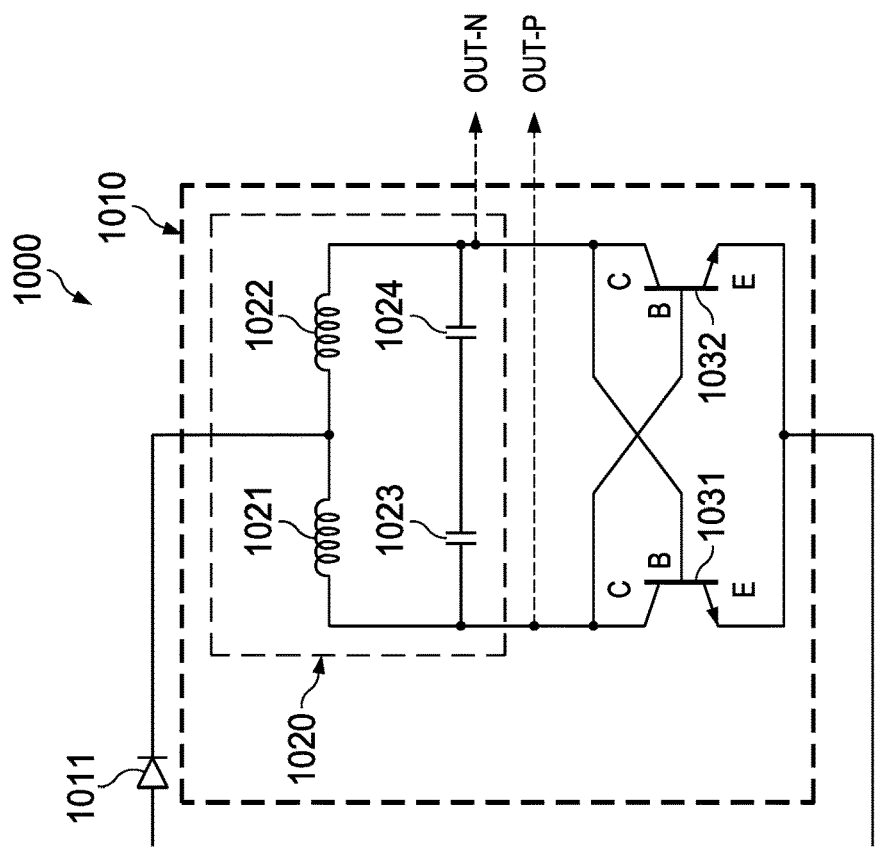

In FIGS. 10(*a*) and 10(*b*), diode emulating oscillator 1000 comprises LC oscillator circuit 1010 including LC tank circuit 1020 and a pair of cross coupled NPN BJTs 1031, 1032 coupled to LC tank circuit 1020. LC tank circuit 1020 of FIGS. 10(*a*) and (*b*) comprises a pair of inductors 1021, 1022 coupled in series, and a pair of capacitors 1023, 1024 coupled in series. The pair of capacitors 1023, 1024 is coupled to the pair of inductors 1021, 1022 in parallel, a collector of first BJT 1031 of the pair of cross coupled NPN BJTs 1031, 1032 is coupled to an end of LC tank circuit 1020, and a collector of second BJT 1032 of the pair of cross coupled NPN BJTs 1031, 1032 is coupled to another end of LC tank circuit 1020.

In the example of FIGS. 10(*a*) and 10(*b*), when an input current or voltage above a threshold of LC oscillator circuit is applied to a center tap of the pair of inductors 1021, 1022, an on-off key based modulated signal is output from the ends of the LC tank circuit 1020 as a pair of differential signals output via ports OUT-N and OUT-P.

Further, as illustrated in FIG. 10(*b*), diode emulating oscillator 1000 may comprise voltage drop NPN BJT 1040. A base and a collector of the voltage drop NPN BJT 1040 is coupled to an emitter of each the BJTs of the pair of cross coupled NPN BJTs 1031, 1032.

Figure 11A:
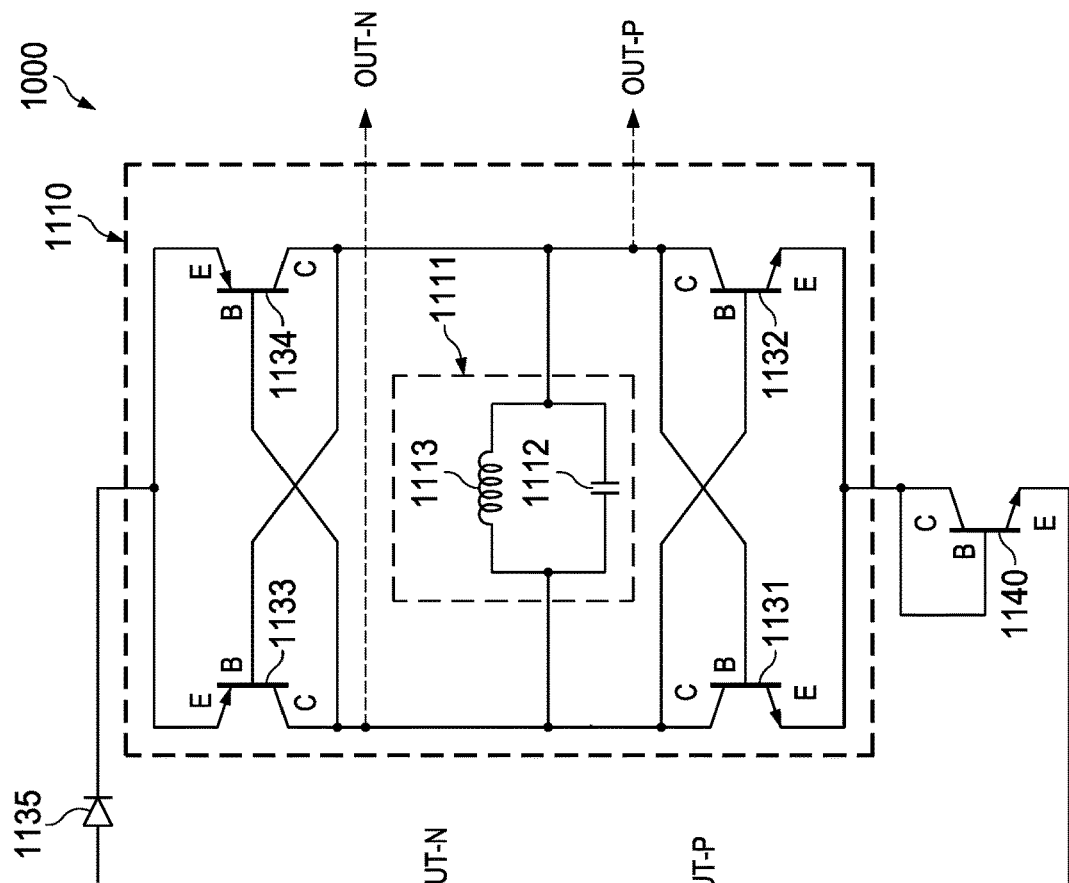

In FIGS. 11(*a*) and 11(*b*), diode emulating oscillator 1000 comprises LC oscillator circuit 1110 including an LC tank circuit 1111, and a set of transistors 1131, 1132, 1133, 1134 coupled to LC tank circuit 1111. In particular, LC tank circuit 1111 comprises inductor 1113 and capacitor 1112 coupled to the inductor 1113 in parallel. The set of transistors 1131, 1132, 1133, 1134 comprises a first pair of cross coupled NPN BJTs 1131, 1132 and a second pair of cross coupled PNP BJTs 1133, 1134.

A collector of first BJT 1131 of the first pair of NPN BJTs 1131, 1132 is coupled to a first end of the LC tank circuit 1111 and a collector of a second BJT 1132 of the first pair of NPN BJTs 1131, 1132 is coupled to a second end the LC tank circuit 1111. A collector of first BJT 1133 of the second pair of PNP BJTs 1133, 1134 is coupled to the first end of LC tank circuit 1111, a collector of second BJT 1134 of the second pair of PNP BJTs 1133, 1134 is coupled to the second end LC tank circuit 1111, and an emitter of first BJT 1133 of the second pair of PNP BJTs 1133, 1134 is coupled to an emitter of second BJT 1134 of the second pair of PNP BJTs 1133, 1134.

After input current or voltage above the threshold of local oscillator circuit 1110 is applied to a center tap coupled to the emitters of the BJTs 1133, 1134 of the second pair of PNP BJTs 1133, 1134, a pair of differential signals, an on-off key based modulated signals, is output from the ends of LC tank circuit 1111 via ports OUT-N and OUT-P.

Figure 11B:
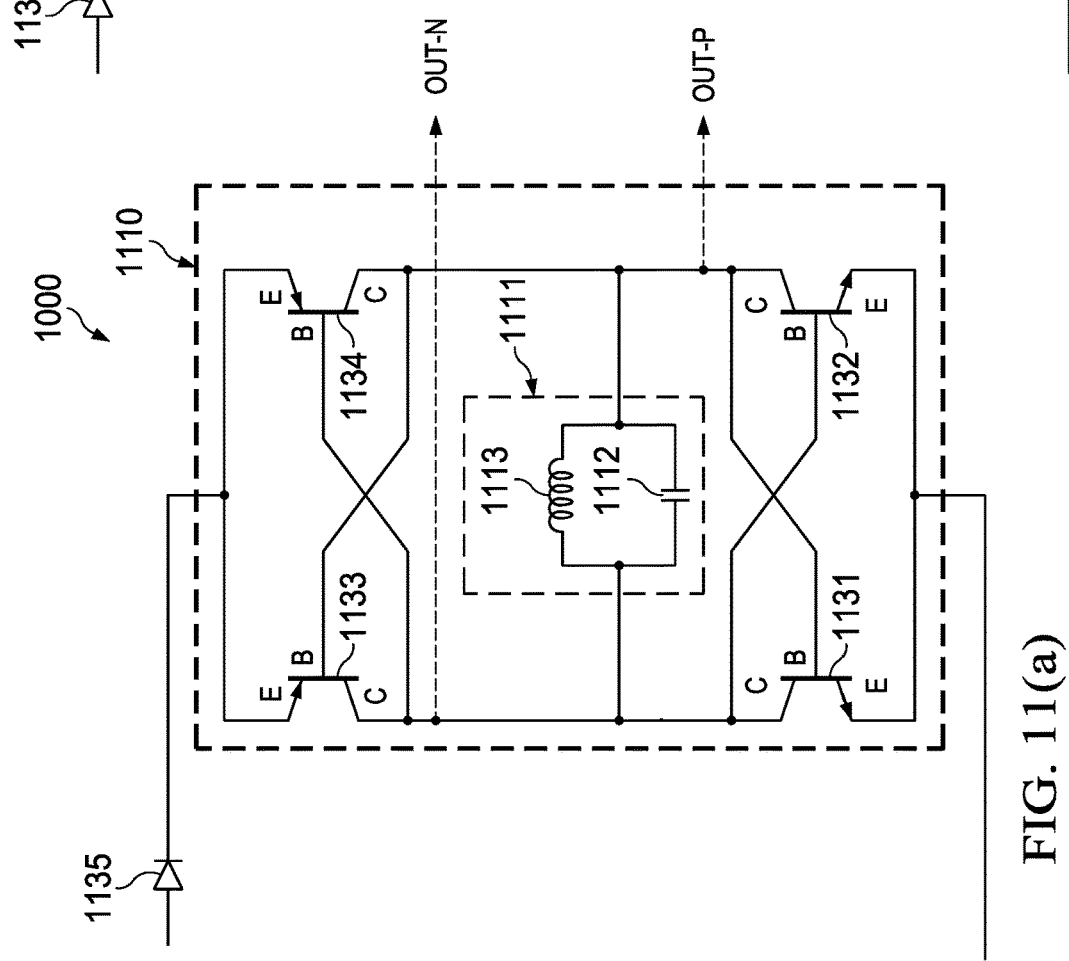

Additionally, as illustrated in FIG. 11(b), diode emulating oscillator 1000 may further comprises voltage drop NPN BJT 1140. A base and a collector of voltage drop NPN BJT 1140 is coupled to an emitter of each transistor of the first pair of cross coupled NPN BJTs 1131, 1132.

Figure 12:
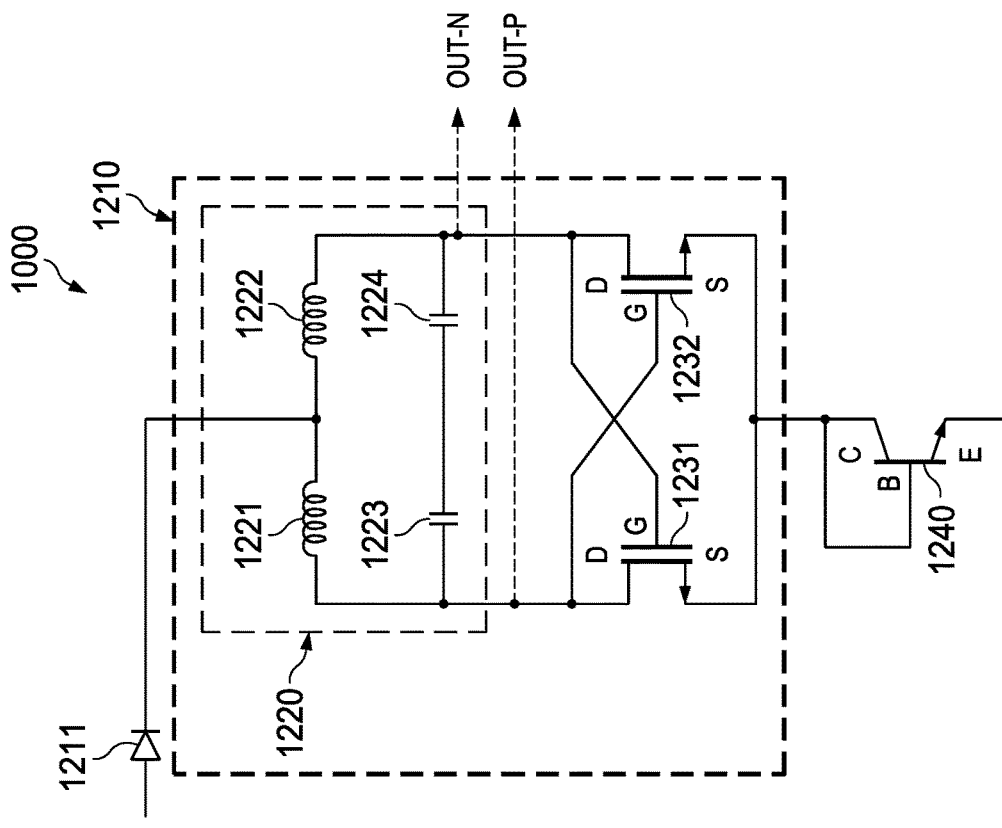

In FIG. 12, diode emulating oscillator 1000 comprises LC oscillator circuit 1210 including LC tank circuit 1220, and a pair of cross coupled NMOS transistor 1231, 1232 coupled to LC tank circuit 1220. In particular, LC tank circuit 1220 comprises a pair of inductors 1221, 1222 coupled in series, and a pair of capacitors 1223, 1224 coupled in series.

The pair of capacitors 1223, 1224 is coupled to the pair of inductors 1221, 1222 in parallel, a drain of first transistor 1231 of the pair of cross coupled NMOS transistors 1231, 1232 is coupled to an end of LC tank circuit 1220, and a drain of second transistor 1232 of the pair of cross coupled NMOS transistors 1231, 1232 is coupled to another end of LC tank circuit 1220.

Input current or voltage to diode emulating oscillator 1000 is applied to a center tap of the pair of inductors 1221, 1222. When the input is above the threshold of LC oscillator circuit 1210, an on-off key based modulated signal is output from the ends of the LC tank circuit (1120) as a pair of differential signals.

Diode emulating oscillator 1000 of FIG. 12 further comprises voltage drop NPN BJT 1240, wherein a base and a collector of voltage drop NPN BJT 1240 is coupled to a source of each of the transistors of the pair of cross coupled NMOS transistors 1231, 1232.

Figure 13:
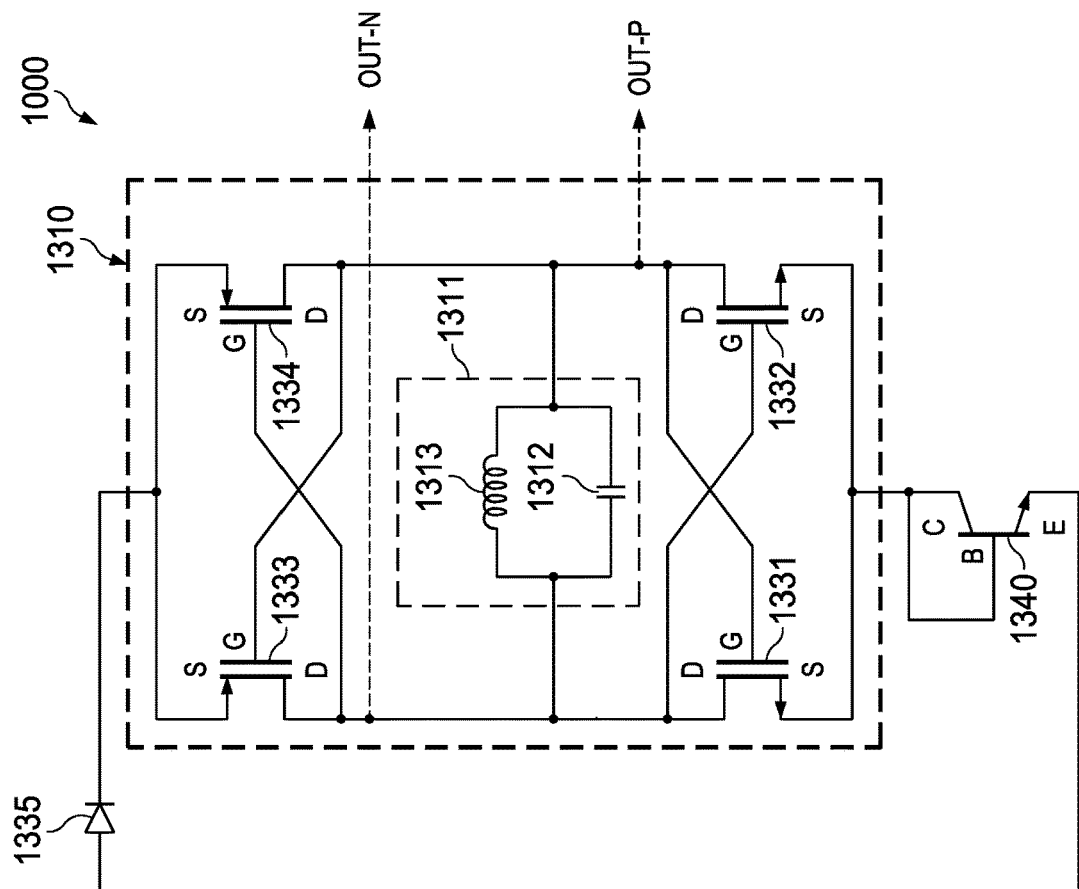

In the example of FIG. 13, diode emulating oscillator 1000 comprises LC oscillator circuit 1310 including LC tank circuit 1311, and a set of transistors 1331, 1332, 1333, 1334 coupled to LC tank circuit 1311. LC tank circuit 1311 comprises inductor 1313 and capacitor 1312 coupled to inductor 1313 in parallel. The set of transistors 1331, 1332, 1333, 1334 comprises a first pair of cross coupled NMOS transistors 1331, 1332 and a second pair of cross coupled NMOS transistors 1333, 1334.

A drain of first NMOS transistor 1331 of the first pair of NMOS transistors 1331, 1332 is coupled to a first end of LC tank circuit 1311 and a drain of second NMOS transistor 1332 of the first pair of NMOST transistors 1331, 1332 is coupled to a second end of LC tank circuit 1311. A drain of first PMOS transistor 1333 of the second pair of PMOS transistors 1333, 1334 is coupled to the first end of LC tank circuit 1311, a drain of second PMOS transistor 1334 of the second pair of PMOS transistors 1333, 1334 is coupled to the second end of LC tank circuit 1311, and a source of first PMOS transistor 1333 of the second pair of PMOS transistors 1333, 1334 is coupled to a source of second PMOS transistor 1334 of the second pair of PMOS transistors 1333, 1334.

When the input current or voltage of diode emulating oscillator 1000 is applied to a center tap coupled to the sources of transistors 1333, 1334 of the second pair of PMOS transistors 1333, 1334, the modulated signal, on-off key based, is output from the ends of LC tank circuit as a pair of differential signals via ports OUT-N and OUT-P.

Diode emulating oscillator 1000 of FIG. 13 further comprises voltage drop NPN BJT 1340. A base and a collector of voltage drop NPN BJT 1340 is coupled to a source of each the NMOS transistors of the first pair of cross coupled NMOS transistors 1331, 1332.

The diode emulating isolator 1000 of FIGS. 10-13 may also comprise diode 1011, 1135, 1211, 1335, respectively, to prevent reverse current flow when current is applied to the diode emulating oscillator. According to an aspect of the present invention, diode 1011, 1135, 1211, 1335 may be replaced with CMOS transistor or any other reverse current flow preventing circuity.

The above description and drawings are only to be considered illustrative of an example of the present invention which achieves the features and advantages described herein. Modifications are possible in the described examples, and other examples are possible, within the scope of the claims. Accordingly, the examples of the present invention described herein are not considered as being limited by the foregoing description and drawings.

What is claimed is:

1. A diode emulating oscillator comprising:
a first set of bipolar junction transistors coupled in series;
an inductor capacitor (LC) oscillator coupled to the first set of bipolar junction transistors in parallel; and
a current mirror transistor coupled to the LC oscillator and the first set of bipolar junction transistors,
wherein a collector of the current mirror transistor is coupled to the LC oscillator and a base of the current mirror transistor is coupled to a base of one of the first set of bipolar transistors, and
when a current flows through the first set of bipolar junction transistors, the current mirror transistor is configured to flow a current proportional to the current flowing through the first set of bipolar junction transistors and the LC oscillator is configured to generate a modulated signal based on the current flowing through the current mirror transistor;
wherein a current gain value of the current mirror transistor in relation to a current gain value of a transistor of the first set of transistors is adjustable.

2. A diode emulating oscillator comprising:
a first set of bipolar junction transistors coupled in series;
an inductor capacitor (LC) oscillator coupled to the first set of bipolar junction transistors in parallel; and
a current mirror transistor coupled to the LC oscillator and the first set of bipolar junction transistors,
wherein a collector of the current mirror transistor is coupled to the LC oscillator and a base of the current mirror transistor is coupled to a base of one of the first set of bipolar transistors, and
when a current flows through the first set of bipolar junction transistors, the current mirror transistor is configured to flow a current proportional to the current flowing through the first set of bipolar junction transistors and the LC oscillator is configured to generate a modulated signal based on the current flowing through the current mirror transistor;
wherein the LC oscillator comprises an inductor capacitor (LC) tank circuit, and a set of transistors coupled to the LC tank circuit,
wherein the LC tank circuit comprises an inductor, and a capacitor coupled to the inductor in parallel, and the set of transistors comprises a first pair of cross coupled NMOS transistors and a second pair of cross coupled PMOS transistors,
wherein a drain of a first transistor of the first pair of cross coupled NMOS transistors is coupled to a first end of the LC tank circuit and a drain of a second transistor of the first pair of cross coupled NMOS transistors is coupled to a second end the LC tank circuit,
wherein sources of the first and second transistors of the first pair of cross coupled NMOS transistors are coupled to the collector of the current mirror transistor,
wherein a drain of a first transistor of the second pair of cross coupled PMOS transistors is coupled to the first end of the LC tank circuit and a drain of a second transistor of the second pair of cross coupled PMOS transistors is coupled to the second end the LC tank circuit, and wherein sources of the first and second transistors of the second pair of cross coupled PMOS transistors are coupled to an end of the first set of bipolar junction transistor configured to receive input current or voltage.

3. A diode emulating oscillator comprising:

a first set of bipolar junction transistors coupled in series;

an inductor capacitor (LC) oscillator coupled to the first set of bipolar junction transistors in parallel; and a current mirror transistor coupled to the LC oscillator and the first set of bipolar junction transistors, wherein a collector of the current mirror transistor is coupled to the LC oscillator and a base of the current mirror transistor is coupled to a base of one of the first set of bipolar transistors, and when a current flows through the first set of bipolar junction transistors, the current mirror transistor is configured to flow a current proportional to the current flowing through the first set of bipolar junction transistors and the LC oscillator is configured to generate a modulated signal based on the current flowing through the current mirror transistor; and a spread spectrum module coupled to the LC oscillator, wherein the spread spectrum module comprises a capacitor coupled to the LC oscillator and is configured to adjust the frequency of the modulated signal;

wherein a voltage over the first set of bipolar junction transistors is configured to supply power to activate the spread spectrum module.

4. A digital isolator comprising:

a diode emulating oscillator configured to generate a modulated signal;

an isolation barrier configured to transmit the modulated signal via a channel; and a receiver configured to receive and demodulate the modulated signal, wherein the diode emulating oscillator comprises a set of bipolar junction transistors coupled in series, and an inductor capacitor (LC) oscillator coupled to the set of bipolar junction transistors in parallel, and wherein the LC oscillator is configured to generate the modulated signal when a current flows through the set of bipolar junction transistors;

wherein the diode emulating oscillator further comprises a current mirror transistor coupled to the LC oscillator and the set of bipolar junction transistors, and wherein a collector of the current mirror transistor is coupled to the LC oscillator and a base of the current mirror transistor is coupled to a base of one of the set of bipolar junction transistors, and the current mirror transistor is configured to flow a current proportional to the current flowing through the set of bipolar junction transistors.

5. The digital isolator of claim 4, wherein a current gain value of the current mirror transistor in relation to a current gain of a transistor of the first set of transistors is adjustable.

6. A digital isolator comprising:

a diode emulating oscillator configured to generate a modulated signal;

an isolation barrier configured to transmit the modulated signal via a channel; and a receiver configured to receive and demodulate the modulated signal, wherein the diode emulating oscillator comprises a set of bipolar junction transistors coupled in series, and an inductor capacitor (LC) oscillator coupled to the set of bipolar junction transistors in parallel, and wherein the LC oscillator is configured to generate the modulated signal when a current flows through the set of bipolar junction transistors;

wherein the LC oscillator comprises an inductor capacitor (LC) tank circuit, and a set of transistors coupled to the LC tank circuit, wherein the LC tank circuit comprises an inductor, and a capacitor coupled to the inductor in parallel, and the set of transistors comprises a first pair of cross coupled NMOS transistors and a second pair of cross coupled PMOS transistors, wherein a drain of a first transistor of the first pair of cross coupled NMOS transistors is coupled to a first end of the LC tank circuit and a drain of a second transistor of the first pair of cross coupled transistors is coupled to a second end the LC tank circuit, wherein sources of the first and second transistors of the first pair of cross coupled NMOS transistors are coupled to the collector of the current mirror transistor, wherein a drain of a first transistor of the second pair of cross coupled PMOS transistors is coupled to the first end of the LC tank circuit and a drain of a second transistor of the second pair of cross coupled PMOS transistors is coupled to the second end the LC tank circuit, and wherein sources of the first and second transistors of the second pair of cross coupled PMOS transistors are coupled to an end of the set of bipolar junction transistor configured to receive input current or voltage.

7. A digital isolator comprising:

a diode emulating oscillator configured to generate a modulated signal;

an isolation barrier configured to transmit the modulated signal via a channel; and a receiver configured to receive and demodulate the modulated signal, wherein the diode emulating oscillator comprises an inductor capacitor (LC) oscillator circuit configured to generate an on-off key based modulated signal after an application of current or voltage input above a threshold of the LC oscillator circuit, wherein the on-off key based modulated signal reflects the application of current or voltage input above the threshold and an amplitude of the input.

8. The digital isolator of claim 7, wherein the LC oscillator circuit comprises an inductor capacitor (LC) tank circuit, and a pair of cross coupled NPN bipolar junction transistors (BJTs) coupled to the LC tank circuit, wherein the LC tank circuit comprises a pair of inductors coupled in series, and a pair of capacitors coupled in series, wherein the pair of capacitors is coupled to the pair of inductors in parallel, a collector of one BJT of the pair of cross coupled NPN BJTs is coupled to an end of the LC tank circuit, a collector of another BJT of the pair of cross coupled NPN BJTs is coupled to another end of the LC tank circuit, and wherein the input is applied to a center tap of the pair of inductors and the modulated signal is output from the ends of the LC tank circuit.

9. The digital isolator of claim 8,
wherein the diode emulating oscillator further comprises a voltage drop NPN BJT,
  wherein a base and a collector of the voltage drop NPN BJT is coupled to an emitter of each BJT of the pair of cross coupled NPN BJTs.

10. The digital isolator of claim 7,
wherein the LC oscillator circuit comprises an inductor capacitor (LC) tank circuit, and a set of transistors coupled to the LC tank circuit,
wherein the LC tank circuit comprises an inductor, and a capacitor coupled to the inductor in parallel, and the set of transistors comprises a first pair of cross coupled NPN bipolar junction transistors (BJTs) and a second pair of cross coupled PNP BJTs,
wherein a collector of a first BJT of the first pair of cross coupled NPN BJTs is coupled to a first end of the LC tank circuit and a collector of a second BJT of the first pair of cross coupled NPN BJTs is coupled to a second end the LC tank circuit,
wherein a collector of a first BJT of the second pair of cross coupled PNP BJTs is coupled to the first end of the LC tank circuit, a collector of a second BJT of the second pair of cross coupled PNP BJTs is coupled to the second end of the LC tank circuit, and an emitter of the first BJT of the second pair of cross coupled PNP BJTs is coupled to an emitter of the second BJT of the second pair of cross coupled PNP BJTs, and
wherein the input is applied to a center tap coupled to the emitters of the first and second BJTs of the second pair of cross coupled PNP BJTs and the modulated signal is output from the ends of the LC tank circuit.

11. The digital isolator of claim 10,
wherein the diode emulating oscillator further comprises a voltage drop NPN BJT,
  wherein a base and a collector of the voltage drop NPN BJT is coupled to an emitter of each transistor of the first pair of cross coupled NPN BJTs.

12. The digital isolator of claim 7,
wherein the LC oscillator circuit comprises an inductor capacitor (LC) tank circuit, and a pair of cross coupled NMOS transistor coupled to the LC tank circuit,
wherein the LC tank circuit comprises a pair of inductors coupled in series, and a pair of capacitors coupled in series,
  wherein the pair of capacitors is coupled to the pair of inductors in parallel, a drain of one transistor of the pair of cross coupled NMOS transistors is coupled to an end of the LC tank circuit, a drain of another transistor of the pair of cross coupled NMOS transistors is coupled to another end of the LC tank circuit, and
  wherein the input is applied to a center tap of the pair of inductors and the modulated signal is output from the ends of the LC tank circuit, and
wherein the diode emulating oscillator further comprises a voltage drop NPN BJT,
  wherein a base and a collector of the voltage drop NPN BJT is coupled to a source of each of the transistors of the pair of cross coupled NMOS transistors.

13. The digital isolator of claim 7,
wherein the LC oscillator circuit comprises an inductor capacitor (LC) tank circuit, and a set of transistors coupled to the LC tank circuit,
wherein the LC tank circuit comprises an inductor, and a capacitor coupled to the inductor in parallel, and the set of transistors comprises a first pair of cross coupled NMOS transistors and a second pair of cross coupled NMOS transistors,
  wherein a drain of a first NMOS transistor of the first pair of cross coupled NMOS transistors is coupled to a first end of the LC tank circuit and a drain of a second NMOS transistor of the first pair of cross coupled NMOST transistors is coupled to a second end of the LC tank circuit,
  wherein a drain of a first PMOS transistor of the second pair of cross coupled PMOS transistors is coupled to the first end of the LC tank circuit, a drain of a second PMOS transistor of the second pair of cross coupled PMOS transistors is coupled to the second end of the LC tank circuit, and a source of the first PMOS transistor of the second pair of PMOS transistors is coupled to a source of the second PMOS transistor of the second pair of PMOS transistors, and
  wherein the input is applied to a center tap coupled to the sources of the first and second PMOS transistors of the second pair of cross coupled PMOS transistors and the modulated signal is output from the ends of the LC tank circuit, and
wherein the diode emulating oscillator further comprises a voltage drop NPN bipolar junction transistor (BJT),
  wherein a base and a collector of the voltage drop NPN BJT is coupled to a source of each the first and second NMOS transistors of the first pair of cross coupled NMOS transistors.

* * * * *